United States Patent
Wald

[11] 3,982,260
[45] Sept. 21, 1976

[54] LIGHT SENSITIVE ELECTRONIC DEVICES
[75] Inventor: Fritz Wald, Wayland, Mass.
[73] Assignee: Mobil Tyco Solar Energy Corporation, Waltham, Mass.
[22] Filed: Aug. 1, 1975
[21] Appl. No.: 601,327

[52] U.S. Cl. ................................ 357/15; 357/16; 357/30; 357/4; 357/61
[51] Int. Cl.². .................... H01L 27/14; H01L 29/48
[58] Field of Search .................. 357/30, 15, 61, 16, 357/4

[56] References Cited
UNITED STATES PATENTS

| | | |
|---|---|---|
| 2,854,611 | 9/1958 | Smith ............................... 317/237 |
| 3,560,812 | 2/1971 | Hull ................................. 317/234 |
| 3,622,844 | 11/1971 | Barelli ............................. 317/234 |
| 3,755,002 | 8/1973 | Hirai ................................ 148/1.5 |
| 3,778,684 | 12/1973 | Fischer ......................... 317/234 R |
| 3,845,494 | 10/1974 | Ameurlaine ....................... 357/30 |

OTHER PUBLICATIONS
Anderson et al., *Journal of Appl. Phys.*, vol. 45, No. 9, Sept. 1974.

*Primary Examiner*—Martin H. Edlow
*Attorney, Agent, or Firm*—Schiller & Pandiscio

[57] ABSTRACT

The invention provides light sensitive electronic devices wherein cadmium telluride films are supported on iron substrates.

10 Claims, 4 Drawing Figures

LIGHT SENSITIVE ELECTRONIC DEVICES

This invention relates to light sensitive solid state electronic devices and more particularly to substrates for cadmium telluride photoconductive and photovoltaic devices.

Currently light sensitive solid state solar cells are made of silicon. However, it has been recognized that solar cells made of cadmium telluride offer the prospect of certain advantages over silicon cells. For one thing, the emf of a cadmium telluride solar cell is approximately twice that of a silicon cell. Secondly, the conversion efficiency of a silicon solar cell tends to decrease sharply as the temperature rises above about 160°C, whereas the efficiency of cells made of cadmium telluride is affected to a lesser extent by changes in temperature. However, thick film cadmium telluride devices are not feasible for many applications due to the relatively high cost of semiconductor grade CdTe. On the other hand, cadmium telluride thin film devices are feasible since the materials cost is much smaller and the devices can be manufactured to close tolerances using well known thin film deposition and fabrication techniques. In this connection, it is to be noted that cadmium telluride has a much higher absorption coefficient for sunlight than does silicon and hence only about 2–5 microns thickness of active material is required to produce an effective solar cell. However, thin film CdTe needs to be supported physically in order to produce a device with physical integrity and adequate dimensional stability. Such support may be provided by depositing the CdTe film on a stiff or resilient substrate which is made of a material that will not diffuse into the film or vice versa and preferably forms an ohmic contact or is receptive to an ohmic layer interposed between it and the film. Prior to this invention molybdenum has been used as a supporting substrate material for cadmium telluride, with cadmium sulfide being disposed as an intermediate layer between the film and substrate (presumably the cadmium sulfide is used for thermal matching or to provide a secure or ohmic bond). Such devices have not been made in large quantities because the molybdenum substrates are quite costly, particularly because of the fact that the substrates must be free of impurities that might "poison" the cadmium telluride and thereby destroy the cell's performance.

Accordingly, the primary object of this invention is to provide a new and relatively inexpensive semiconductor grade substrate material for thin film cadmium telluride photoconductive and photovoltaic devices.

Another object is to provide a solid state light sensitive electronic device comprising a film of cadmium telluride bonded to a substrate which forms a strong bond and provides the device with structural integrity and dimensional stability.

Still another object is to provide a light sensitive electronic device wherein a film of cadmium telluride is bonded to a relatively inexpensive substrate which forms an ohmic contact and is made of a material which will not "poison" the film.

A further object is to provide a substrate for cadmium telluride films which not only bond directly to such films but also to a variety of other materials that can serve as bonding or ohmic contact layers.

Described briefly, the present invention consists of utilizing iron of selected purity as a substrate material for cadmium telluride. The latter may be bonded directly to the iron with the iron providing an ohmic contact, or the cadmium telluride and iron may be joined by one or more intermediate layers that form ohmic bonds and are designed to extend the life or performance of the device. Other features and advantages of the invention are presented in the following detailed description which is to be considered together with the accompanying drawings wherein.

In the drawings, identical parts are identified by the same numerals.

Figure 1:
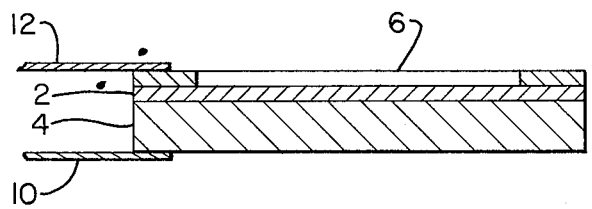
FIG. 1 is a sectional view in side elevation of a photoconductor embodying an iron substrate.

In the development of this invention it has been determined that (1) cadmium telluride films adhere to iron very well up to temperatures of about 350°C; (2) iron is not a dopant for cadmium telluride and, therefore, no harm results if iron should migrate by diffusion into the cadmium telluride or vice versa; and (3) iron forms an ohmic contact with cadmium telluride. Furthermore, iron is relatively strong and hence is of great assistance in maintaining the structural integrity of the adherent cadmium telluride film. Iron also bonds well to a variety of other materials that can be disposed as intermediate layers for bonding or contact purposes and many different processes are known for coating iron with specific materials, e.g. tin, indium, etc. Also the diffusion characteristics of iron with respect to other materials and vice versa are well known because of the many industrial and scientific uses to which iron has been applied. Most importantly, essentially pure iron is readily available in sheet or bar form and at prices which are low in comparison to cadmium telluride, molybdenum, cadmium sulfide and silicon in comparable form and quality. Also iron is easily obtainable in forms which are free of any impurities which might "poison" or otherwise adversely affect the electrical properties of cadmium telluride. A further important advantage is that iron can be machined or ground by old and very well known techniques to a smoothness which satisfies the fabrication and film continuity requirements of thin film devices. Still another advantage is that cadmium telluride films can be formed on iron substrates by deposition from the vapor phase by well known techniques, and such films can be made with uniform and precisely controlled thicknesses. Furthermore, although this invention is particularly useful in providing solar cells which embody cadmium telluride, it offers the advantage that it is applicable to other light sensitive electronic devices. Thus, in the context of this specification, the term "light sensitive electronic devices" includes devices used as light or radiation detectors as well as devices used primarily for power generators, and includes photoconductors as well as photodiodes and phototransistors and other light sensitive rectifying devices.

For the purpose of this invention the iron substrate must be free of impurities which interact with CdTe or otherwise modify its electrical properties. Pure iron obviously is suitable, as is iron with impurities that are inocuous with respect to cadmium telluride. An inocuous impurity is one which is substantially inert, i.e. does not interact with CdTe, and does not modify the electrical or electronic properties of CdTe. Silicon, carbon, nitrogen and sulfur qualify as inocuous impurities; however, iron with manganese or phosphorous in trace quantities or greater is not suitable for this invention. By way of example, iron with 4 wt. % silicon and 2 wt. % carbon may be used as a substrate material for this invention. As used herein, the term "substantially pure iron" is to be construed as denoting iron which is free of impurities that interact with CdTe or otherwise modify its electrical or electronic properties and which may or may not contain impurities that are inocuous or inert with respect to cadmium telluride.

Turning now to FIG. 1, the invention may be used to provide a photoconductor device which essentially comprises a thin undoped cadmium telluride film 2 on a substantially pure iron substrate 4. The term "undoped" is intended to denote the fact that the telluride is substantially free of impurities of the type that modify its conductivity. Bonded to the opposite side of the film 2 is a thin layer 6 of indium. The latter layer preferably covers only the outer margin of the film 2, leaving the majority of the upper surface of the film exposed to receive light, e.g. sunlight. Both the iron substrate and the indium make ohmic rather than rectifying junctions with the cadmium telluride film, and suitable terminal contacts in the form of metal leads 10 and 12 are attached to the substrate and indium layer for the purpose of coupling the device into a suitable electrical circuit. By way of example, the relative thicknesses of the iron substrate, cadmium telluride film and indium layer may be 0.03 cm, 3.0 microns, and 0.005 cm respectively. In such a device the cadmium telluride serves as a photoconductor, its electrical resistance decreasing with increasing light stimulation, and the iron substrate 4 and indium layer 6 function as electrodes. Of course, the indium could be deposited in a different geometric configuration, e.g. a grid pattern, which leaves an adequate portion of the upper surface of the cadmium telluride film exposed to light.

Figure 2:
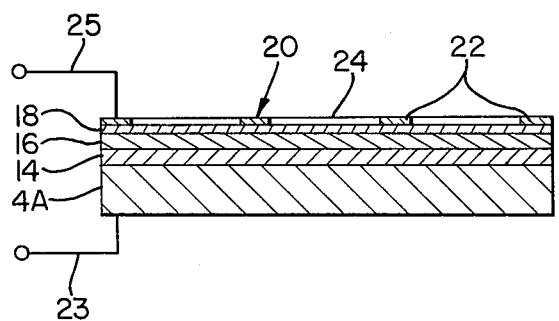
FIG. 2 is a similar view of a hetero or P-N junction solar cell with an iron substrate.

In the embodiment of FIG. 2, the iron substrate 4A is coated on one side with a relatively thin layer 14 of indium. The indium layer is bonded to the iron substrate and makes an ohmic contact therewith. Overlying and bonded to the indium is a film or layer 16 of undoped cadmium telluride. The layer 14 also makes an ohmic contact with layer 16. Overlying and bonded to the layer 16 is a film or layer 18 of undoped copper telluride. Overlying and bonded to the copper telluride film is a conductive layer 20 in the form of a grid consisting of a plurality of fingers 22 connected by at least one collector or bus bar 24. The layer 20 is made of aluminum or indium and forms an ohmic contact with the copper telluride film. By way of example, the relative thickness of the substrate 4A and the layers 14, 16, 18 and 20 may be 0.025 cm, 0.005 cm, 0.005 cm, 5.0 microns, and 0.001 cm. In such a device, the iron substrate 4 and the aluminum or indium grid 20 function as electrodes, the indium layer 14 provides improved adhesion of the telluride to the iron substrate, and the cadmium and copper telluride layers 16 and 18 form a light-sensitive rectifying junction. When the foregoing device is connected to an external circuit by suitable terminal leads shown schematically at 23 and 25 and its copper telluride layer is illuminated by sunlight, a photovoltaic output or emf is generated across the rectifying junction and current is delivered to the exterior circuit.

Figure 3:
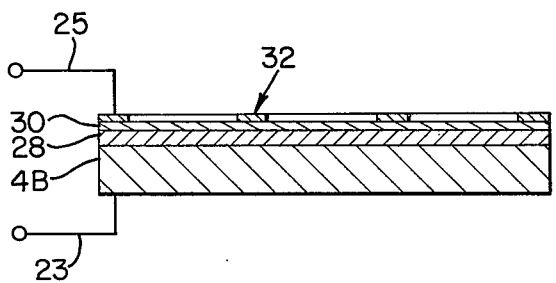
FIG. 3 is a similar view of a homo-junction cadmium telluride solar cell with an iron substrate.

In the embodiment of FIG. 3, an iron substrate 4B with a thickness of approximately 0.04 cm is coated on one side with a layer 28 of p-type cadmium telluride (e.g. phosphorous-doped cadmium telluride) measuring approximately 2.0 microns in thickness. The iron substrate makes an ohmic contact with layer 28. Fully covering and bonded to layer 28 is a layer 30 of n-type cadmium telluride (e.g. iodine-doped cadmium telluride) having a thickness of about 2 microns. A grid 32 similar in form to grid 20 overlies and is bonded to and forms an ohmic contact with layer 30. Grid 32 is made of aluminum, indium or zinc and may have a thickness of about 0.005 cm. Grid 32 and substrate 4B function as electrodes and layers 28 and 30 form a photoresponsive rectifying junction. Hence, if the device is coupled to an external circuit by conductive terminal leads 23 and 25 connected to substrate 4A and grid 32 respectively, an emf will be produced and current will flow in the external circuit when the n-type cadmium telluride layer is illuminated by solar energy.

Figure 4:
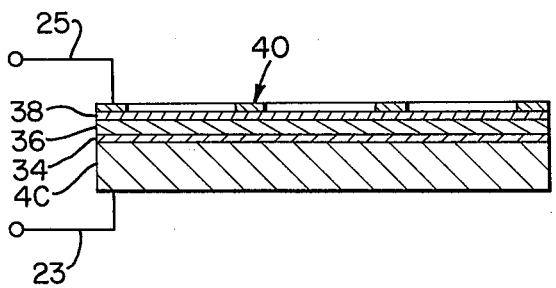
FIG. 4 is a similar view of a Schottky barrier device with an iron substrate.

FIG. 4 illustrates a Schottky-barrier solar cell comprising an iron substrate 4C, an n-type cadmium telluride layer 36 bonded to the substrate by an intervening layer 34 of indium metal, a transparent gold film 38 fully overlying and bonded to the cadmium telluride layer, and a grid 40 made of aluminum or indium overlying and bonded to the gold film. The grid 40 is similar in geometry to grids 20 and 32. The substrate 4C and the grid 40 make ohmic contact with layers 34 and 38 respectively and thus can function as electrodes to which leads 22 and 24 may be connected for coupling the device to an external circuit. By way of example, the relative thicknesses of substrate 4C, layers 34, 36 and 38, and grid 40 may be 0.03 cm, 0.001 cm, 3.0 microns, 80 A. units and 0.005 cm. The gold layer 38 forms a photoresponsive Schottky-barrier rectifying region or junction with the n-type cadmium telluride, so that an emf is produced across the junction and current will flow to an exterior circuit via leads 23 and 25 when the gold layer is illuminated with sunlight.

Of course, the devices herein described may be modified without eliminating the use or advantages of this invention. Thus, for example, the relative thicknesses of the components may be varied substantially. Also, for example, the embodiments of FIGS. 1 and 3 may be modified by incorporating a layer of indium between the substrates 4A and 4B and the layer of cadmium telluride. Similarly, a metal other than indium, or an other semiconductor, (e.g. aluminum, tin telluride or lead telluride) may be used to bond cadmium telluride to the iron substrate. The electrodes on the light-receiving sides of the above-described devices also may be made of a material other than indium or aluminum. Thus, by way of example, the contact 6 of FIG. 1 and the grids 20, 32 and 40 may be made of iron. It should be understood also that two or more layers of different metals may be used to bond the cadmium telluride to the iron substrate. Thus, for example, a layer of silver may be interposed between iron substrate 4C and the indium layer 34, to provide improved bonding or a lower electrical resistance coupling.

The invention also is not limited in its application to the devices herein described and may be used to provide other photoconductive and photovoltaic devices. Thus, iron may be used as the substrate for the cadmium telluride component in a surface barrier solar cell comprising a transparent film of indium oxide on a layer of cadmium telluride.

The configuration of the contact 6 or the grids 20, 32 and 40 on the light-receiving sides of the above described devices may be designed according to well-known practices. Thus, by way of example, but not limitation, those electrodes may have a geometry similar to the electrodes shown in U.S. Pat. No. 3,589,946 or disclosed by Anderson et al, "An 8% Efficient Layered Schottky-Barrier Solar Cell", Journal of Applied Physics, Vol. 45, No. 9, pp. 3913–3915, September 1974. Preferably the upper contact or grid electrode covers no more than about 20% of the lightreceiving side of the device of which it forms a part, so as to maximize the current output. It also is contemplated that anti-reflective coatings of suitable composition may be applied over the light receiving surfaces and the upper contacts or grid electrodes of devices employing this invention. The use of such coatings is well known and is shown by Anderson et al, supra.

I claim:

1. A light sensitive electronic device comprising an iron substrate and a layer of cadmium telluride having one side thereof bonded to and making an ohmic connection with said iron substrate.

2. A device according to claim 1 comprising a conductive electrode bonded to and making an ohmic contact with an opposite side of said layer of cadmium telluride.

3. A device according to claim 2 wherein said electrode covers only a minor portion of the surface area of said opposite side.

4. A device according to claim 2 wherein said electrode is made of indium, aluminum or zinc.

5. A device according to claim 1 comprising means forming a photovoltaic rectifying junction with said layer of cadmium telluride at the side thereof opposite to said one side.

6. A device according to claim 5 wherein said means comprises a transparent metal film.

7. A device according to claim 5 wherein said means comprises a transparent film of a metal telluride and said junction is a hetero junction.

8. A device according to claim 7 wherein said metal telluride is copper telluride.

9. A device according to claim 5 wherein said cadmium telluride is of one conductivity type and said means comprises a film of opposite conductivity type cadmium telluride.

10. A device according to claim 5 wherein said means comprises a transparent film covering and bonded to said opposite side of said layer of cadmium telluride, and further including an electrode in the form of a grid overlying and bonded to said transparent film, said electrode covering only a minor portion of the surface area of said film.

* * * * *